US008603843B2

(12) United States Patent
Song et al.

(10) Patent No.: US 8,603,843 B2
(45) Date of Patent: Dec. 10, 2013

(54) MANUFACTURING METHOD FOR ARRAY SUBSTRATE WITH FRINGE FIELD SWITCHING TYPE THIN FILM TRANSISTOR LIQUID CRYSTAL DISPLAY

(75) Inventors: Youngsuk Song, Beijing (CN); Seungjin Choi, Beijing (CN); Seongyeol Yoo, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 13/381,157

(22) PCT Filed: Apr. 26, 2011

(86) PCT No.: PCT/CN2011/073335
§ 371 (c)(1),
(2), (4) Date: Dec. 28, 2011

(87) PCT Pub. No.: WO2011/134389
PCT Pub. Date: Nov. 3, 2011

(65) Prior Publication Data
US 2012/0107982 A1    May 3, 2012

(30) Foreign Application Priority Data

Apr. 26, 2010 (CN) .......................... 2010 1 0158983

(51) Int. Cl.
*H01L 21/00* (2006.01)
(52) U.S. Cl.
USPC ............. 438/30; 438/151; 438/158; 438/159; 257/E21.414
(58) Field of Classification Search
USPC ................... 438/30, 151, 158, 159, 149, 155; 257/E21.414
See application file for complete search history.

(56) References Cited

U.S. PATENT DOCUMENTS 6,537,840 B2 *   3/2003   Tseng ............................. 438/30
7,005,331 B2 *   2/2006   Chen ............................. 438/158
(Continued)

FOREIGN PATENT DOCUMENTS

| CN | 101105615 A | 1/2008 |
| CN | 10129912 A | 11/2008 |
| CN | 101630098 A | 1/2010 |
| CN | 101963726 A | 2/2011 |
| KR | 20080012810 A | 2/2008 |

OTHER PUBLICATIONS

International Search Report: mailed Jul. 28, 2011; PCT/CN2011/073335.
KIPO Notice of Allowance dated Apr. 1, 2013; Appln. No. 10-2011-7031558.
International Preliminary Report on Patentability dated Nov. 8, 2012; International Application No. PCT/CN2011/073335.

*Primary Examiner* — Michael Trinh
(74) *Attorney, Agent, or Firm* — Ladas & Parry LLP

(57) ABSTRACT

Disclosed is a method for manufacturing an array substrate of an FFS type TFT-LCD, comprising the steps of: forming a first transparent conductive film, a first metal film and an impurity-doped semiconductor film on a transparent substrate sequentially, and then patterning the stack of the films to form patterns including source electrodes, drain electrodes, data lines and pixel electrodes; forming a semiconductor film and patterning it to form a pattern of the impurity-doped semiconductor layer and a pattern of the semiconductor layer including TFT channels; forming an insulating film and a second metal film, and patterning the stack of the films to form patterns including connection holes of the data lines in a PAD region, gate lines, gate electrodes and common electrode lines; forming a second transparent conductive film, and patterning it to form patterns including the common electrode.

15 Claims, 17 Drawing Sheets

(56) References Cited

U.S. PATENT DOCUMENTS

| | | | |
|---|---|---|---|
| 7,480,015 B2 * | 1/2009 | Kim et al. | 349/43 |
| 7,867,796 B2 * | 1/2011 | Nam et al. | 438/30 |
| 8,030,104 B2 * | 10/2011 | Park et al. | 438/29 |
| 2007/0020822 A1 | 1/2007 | Chou et al. | |
| 2008/0030639 A1 | 2/2008 | Qiu et al. | |
| 2008/0266479 A1 | 10/2008 | Lim | |
| 2009/0032819 A1 * | 2/2009 | Lim et al. | 257/72 |
| 2010/0012946 A1 | 1/2010 | Zhi et al. | |

* cited by examiner

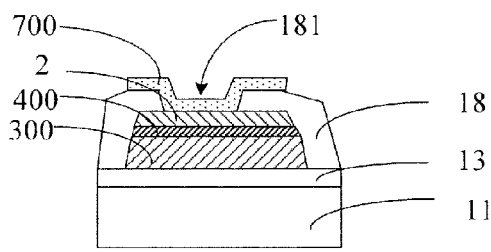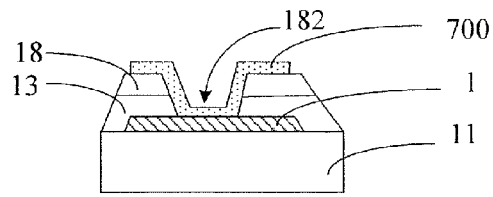
FIG. 2B　　　　　　　　　　　FIG. 2C
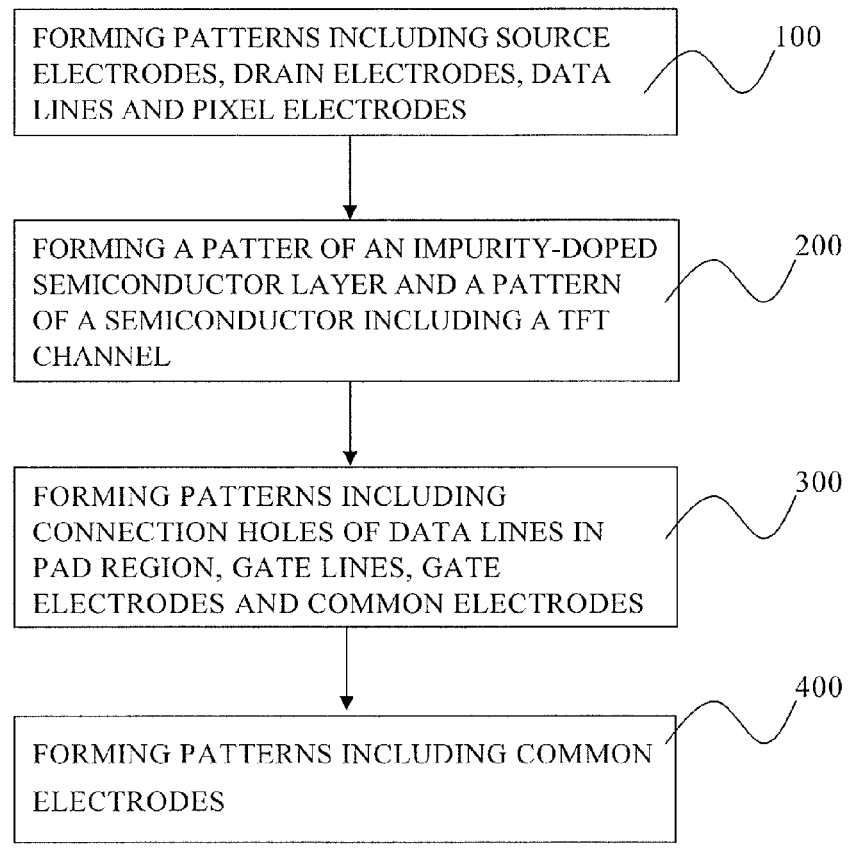
FIG. 3

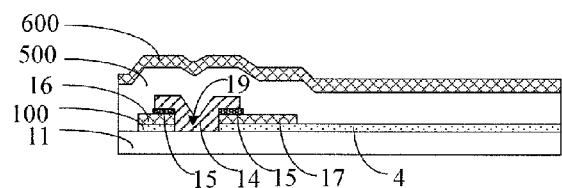 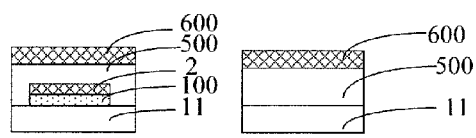 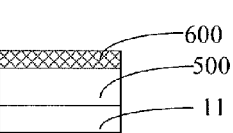
FIG. 25A  FIG. 25B  FIG. 25C
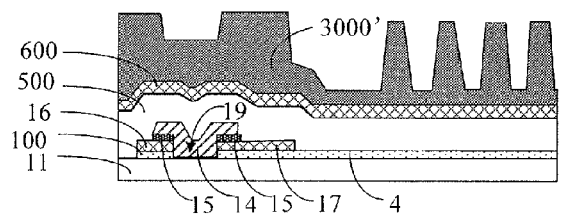 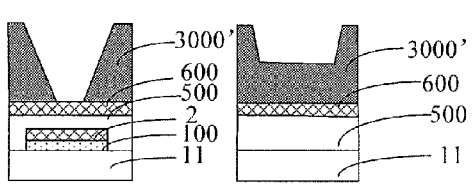 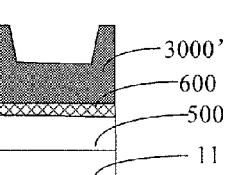
FIG. 26A  FIG. 26B  FIG. 26C

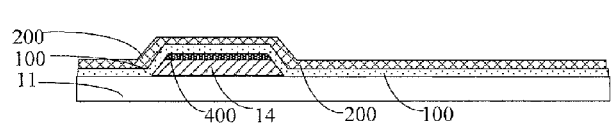 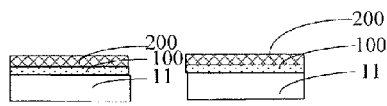
FIG. 39A  FIG. 39B  FIG. 39C
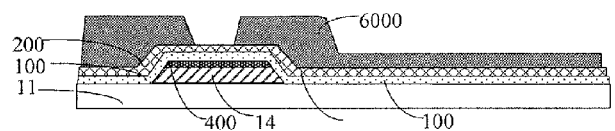 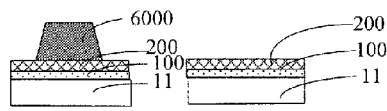
FIG. 40A  FIG. 40B  FIG. 40C
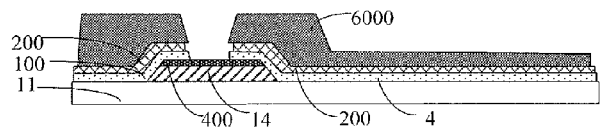 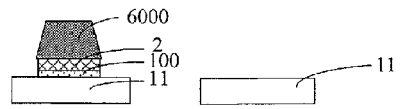
FIG. 41A  FIG. 41B  FIG. 41C
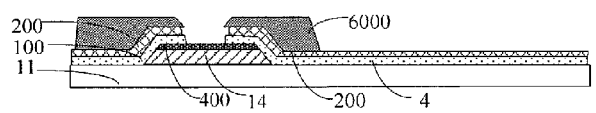 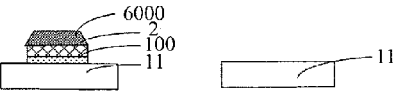
FIG. 42A  FIG. 42B  FIG. 42C
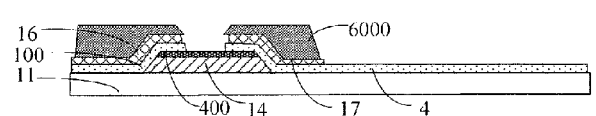 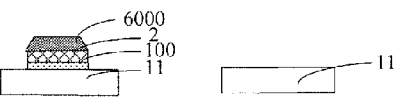
FIG. 43A  FIG. 43B  FIG. 43C

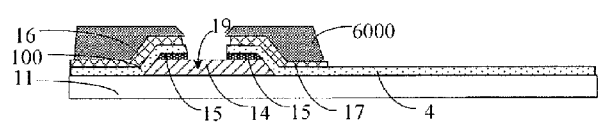 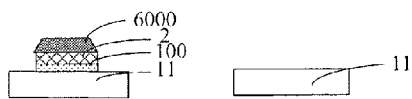 
FIG. 44A    FIG. 44B    FIG. 44C
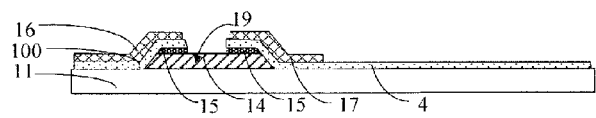 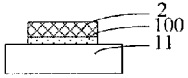 
FIG. 45A    FIG. 45B    FIG. 45C
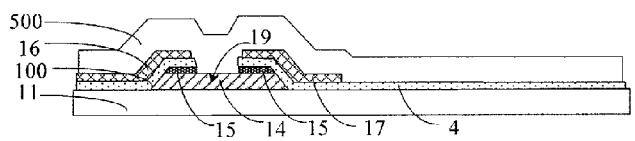 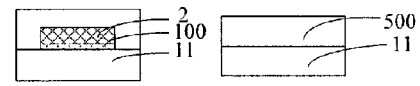 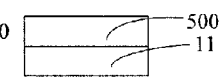
FIG. 46A    FIG. 46B    FIG. 46C
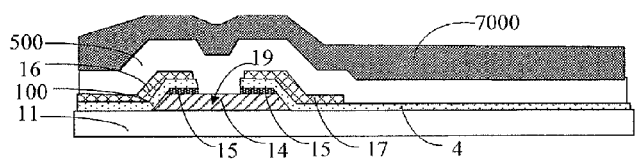 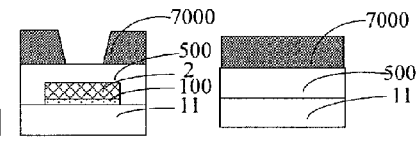 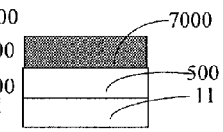
FIG. 47A    FIG. 47B    FIG. 47C
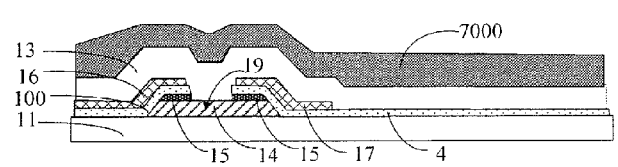 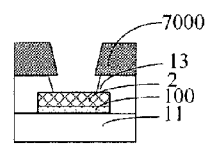 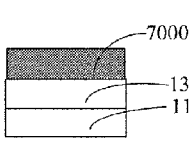
FIG. 48A    FIG. 48B    FIG. 48C

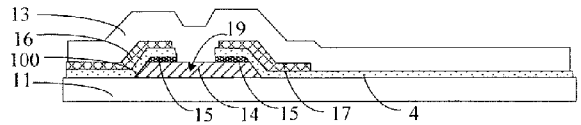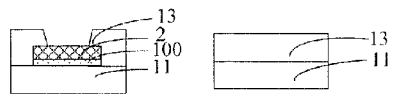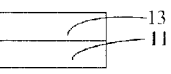
FIG. 49A  FIG. 49B  FIG. 49C
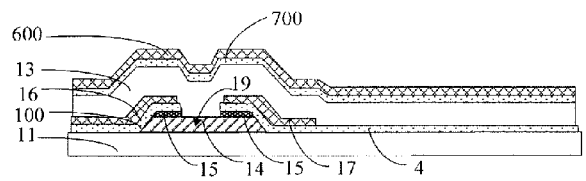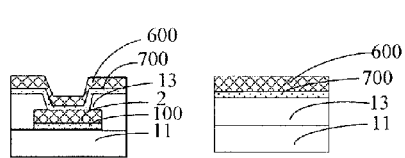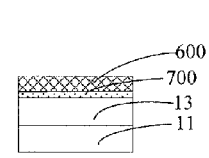
FIG. 50A  FIG. 50B  FIG. 50C
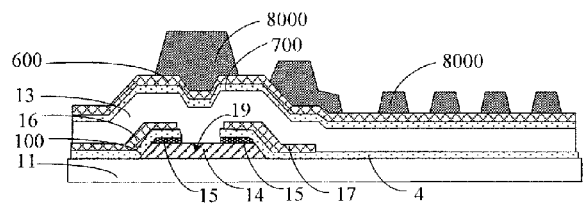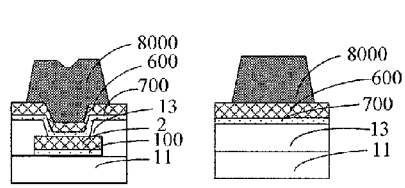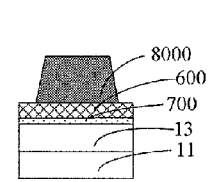
FIG. 51A  FIG. 51B  FIG. 51C
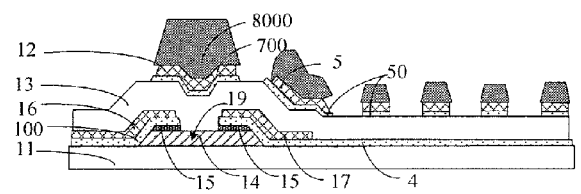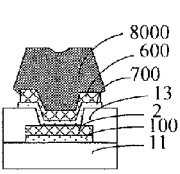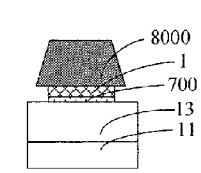
FIG. 52A  FIG. 52B  FIG. 52C

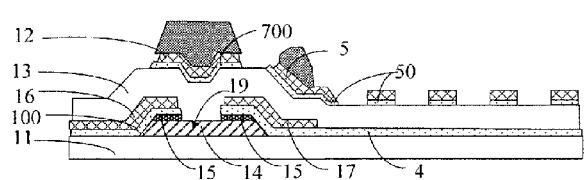 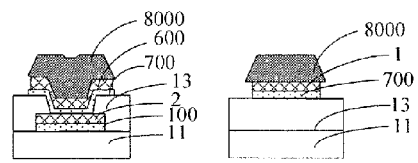 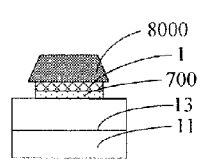
FIG. 53A	FIG. 53B	FIG. 53C
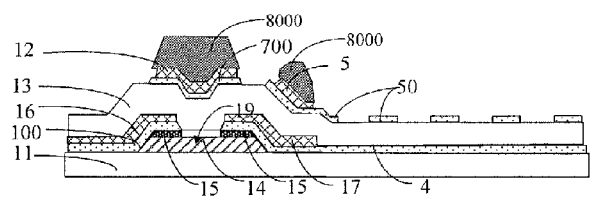 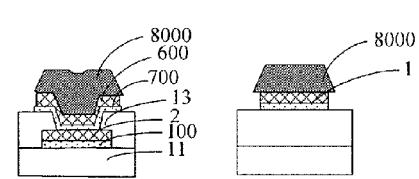 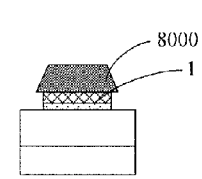
FIG. 54A	FIG. 54B	FIG. 54C
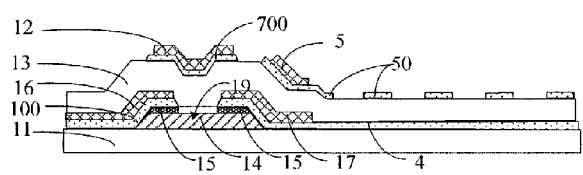 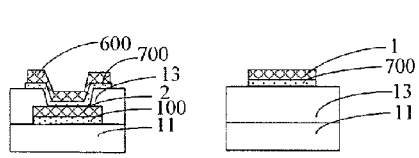 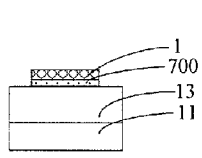
FIG. 55A	FIG. 55B	FIG. 55C

MANUFACTURING METHOD FOR ARRAY SUBSTRATE WITH FRINGE FIELD SWITCHING TYPE THIN FILM TRANSISTOR LIQUID CRYSTAL DISPLAY

TECHNICAL FIELD

The present invention relate to a method for manufacturing an array substrate of fringe-field switch (FFS) type thin film transistor liquid crystal display (TFT-LCD).

BACKGROUND

The thin film transistor liquid crystal display devices (TFT-LCD) belong to a main kind of flat panel display devices (FPD).

Based on the direction of the electrical field for driving the liquid crystal, TFT-LCD can be divided into a vertical field type and a horizontal field type. For the vertical field type TFT-LCD, it is necessary to form pixel electrodes on an array substrate and form common electrodes on a color filter substrate. However, for the horizontal field type TFT-LCD, it is necessary to faun pixel electrodes and common electrodes on the array substrate. As a result, during manufacturing the array substrate of the horizontal field type TFT-LCD, as compared with the array substrate of the vertical field type TFT-LCD, additional masking process for forming the common electrodes is required. The vertical field type TFT-LCD can include a twist nematic (TN) type TFT-LCD. The horizontal field type TFT-LCD can include a fringe field switching (FFS) type TFT-LCD, an in-plane switching (IPS) type TFT-LCD and the like. The horizontal field type TFT-LCD, particularly FFS type TFT-LCD, has advantages of wide viewing angle, high aperture ratio and the like, and is applied widely to the field of the liquid crystal display device.

Currently, the array substrate of the FFS type TFT-LCD is manufactured by forming structural patterns using a plurality of patterning processes, each of which further comprises processes of exposing photoresist by using a mask, developing, etching and peeling off the remaining photoresist and the like. The etching process may comprise dry etching and wet etching. Therefore, the complexity of the process for manufacturing the array substrate of TFT-LCD is determined by the number of patterning processes, and thus reducing of the number of pattern processes would result in a decreased cost. The six patterning processes in the prior art comprise: patterning of a common electrode, patterning of gate lines and gate electrodes, patterning of an active layer, patterning of source electrodes/drain electrodes, patterning of via holes and patterning of pixel electrodes.

The five patterning processes in the prior art for manufacturing the array substrate of an FFS type TFT-LCD is as follows:

Step 1, depositing a first transparent conductive film and forming a pattern of a plate-like common electrode by an ordinary mask;

Step 2, depositing a first metal film and forming patterns of gate lines, gate electrodes and the common electrode by an ordinary mask;

Step 3, depositing a first insulating film, a semiconductor film, an impurity-doped semiconductor film and a second metal film sequentially, and forming patterns of an active layer (the semiconductor film and the impurity-doped semiconductor film), a TFT channel, source electrodes, drain electrodes and data lines by a dual tone mask;

Step 4, depositing a second insulating film, and forming patterns of via holes by using a second dual tone mask so as to form patterns of connection holes in the gate lines region of a PAD region, the data lines region of the PAD region and the common electrode region of the PAD region; and Step 5, depositing a second transparent conductive film, and forming patterns of pixel electrodes with slits by an ordinary mask.

SUMMARY

According to one embodiment of the invention, a method for manufacturing an array substrate of an FFS type TFT-LCD is provided. The method can comprise the steps of: Step 1: forming a first transparent conductive film, a first metal film and an impurity-doped semiconductor film on a transparent substrate sequentially, and then patterning the stack of the first transparent conductive film, the first metal film and the impurity-doped semiconductor film so as to form patterns including source electrodes, drain electrodes, data lines and pixel electrodes; Step 2: forming a semiconductor film, and patterning the semiconductor film so as to form a pattern of the impurity-doped semiconductor layer and a pattern of the semiconductor layer including TFT channels; Step 3: forming an insulating film and a second metal film, and patterning the stack of the insulating film and the second metal film so as to form patterns including connection holes of the data lines in a PAD region, gate lines, gate electrodes and common electrode lines; and Step 4: forming a second transparent conductive film, and patterning the second transparent conductive film so as to form patterns including the common electrode.

According to another embodiment of the invention, a method for manufacturing an array substrate of an FFS type TFT-LCD is provided. The method can comprise: Step 1: forming a first transparent conductive film, a first metal film and an impurity-doped semiconductor film on a transparent substrate sequentially, and then patterning the stack of the first transparent conductive film, the first metal film and the impurity-doped semiconductor film so as to form patterns including source electrodes, drain electrodes, data lines and pixel electrodes; Step 2: forming a semiconductor film, and patterning the semiconductor film so as to form a pattern of the impurity-doped semiconductor layer and a pattern of the semiconductor layer including TFT channels; Step 3': forming an insulating film and a second metal film, and patterning the insulating film and the second metal film, then forming a second transparent conductive film and performing a lifting-off process and an etching process, so as to form patterns including connection holes for the data lines in the PAD region, gate lines, gate electrodes and common electrode lines.

According to further another embodiment of the invention, a method for manufacturing an array substrate of an FFS type TFT-LCD is provided. The method can comprise: Step 100: forming a semiconductor film and an impurity-doped semiconductor film on a transparent substrate sequentially, then patterning the stack of the semiconductor film and the impurity-doped semiconductor film so as to form patterns including a semiconductor layer and an impurity-doped semiconductor layer; Step 200: forming a first transparent conductive film and a first metal film, and patterning the stack of the first transparent conductive film and the first metal film to form patterns including source electrodes, drain electrodes, the impurity-doped semiconductor layer, TFT channels, data lines and pixel electrodes; Step 300: depositing an insulating film, and patterning the insulating film so as to form patterns including connection holes for the data lines in the PAD region; Step 400: forming a second transparent conductive film and a second metal film, and patterning the stack of the second transparent conductive film and the second metal film so as to form patterns including gate lines, gate electrodes and common electrodes.

BRIEF DESCRIPTION OF THE DRAWINGS

FIG. 2B is a cross-sectional view showing data lines in a PAD region of the array substrate of FFS type TFT LCD, FIG. 2C is a cross-sectional view showing gate lines in the PAD region of the array substrate of FFS type TFT LCD;

FIG. 3 is a flow diagram of manufacturing an array substrate of an FFS type TFT-LCD according to a first embodiment of the invention;

FIGS. 4A to 4C are cross-sectional views after forming a first transparent conductive film, a first metal film and an impurity-doped semiconductor film on a transparent substrate, in which FIG. 4A shows a cross-sectional view of a pixel region, FIG. 4B shows a cross section of the gate lines in the PAD region, FIG. 4C shows a cross section of the data lines in the PAD region;

FIGS. 25A to 25C are cross-sectional views after depositing an insulating film and a second metal film on the structure in FIGS. 13A to 13C;

FIGS. 26A to 26C are cross-sectional views after performing exposure and development processes to the structure in FIGS. 25A to 25C applied with a photoresist;

FIGS. 29A to 28C are cross-sectional views after performing an etching process with respect to the structure in FIGS. 27A to 27C;

FIGS. 35A to 35C are cross-sectional views after forming a semiconductor film and an impurity-doped semiconductor film on a transparent substrate, in which FIG. 35A shows a cross-sectional view of a pixel region, FIG. 35B shows a cross section of the gate lines in the PAD region, FIG. 35C shows a cross section of the data lines in the PAD region;

FIGS. 39A to 39C are cross-sectional views after depositing a first transparent conductive film and a first metal film on the structure in FIGS. 38A to 38C;

FIGS. 40A to 40C are cross-sectional views after performing exposure and development processes to the structure in FIGS. 39A to 39C applied with a photoresist;

FIGS. 41A to 41C are cross-sectional views after performing an etching process with respect to the structure in FIGS. 40A to 40C;

FIGS. 42A to 42C are cross-sectional views after performing an ashing process with respect to the photoresist in FIGS. 41A to 41C;

FIGS. 43A to 43C are cross-sectional views after performing an etching process with respect to the first metal film in FIGS. 42A to 42C;

FIGS. 44A to 44C are cross-sectional views after performing an etching process to the impurity-doped semiconductor film in FIGS. 43A to 43C;

FIGS. 45A to 45C are cross-sectional views after peeling off the photoresist in FIGS. 44A to 44C;

FIGS. 46A to 46C are cross-sectional views after depositing an insulating film on the structure in FIGS. 45A to 45C;

FIGS. 47A to 47C are cross-sectional views after performing exposure and development processes to the structure in FIGS. 46A to 46C applied with a photoresist;

FIGS. 48A to 48C are cross-sectional views after performing an etching process to the structure in FIGS. 47A to 47C;

FIGS. 49A to 49C are cross-sectional views after peeling off the photoresist in FIGS. 48A to 48C;

FIGS. 50A to 50C are cross-sectional views after depositing a second transparent conductive film and a second metal film on the structure in FIGS. 49A to 49C;

FIGS. 51A to 51C are cross-sectional views after performing exposure and development processes to the structure in FIGS. 50A to 50C applied with a photoresist;

FIGS. 52A to 52C are cross-sectional views after performing an etching process to the structure in FIGS. 50A to 50C;

FIGS. 53A to 53C are cross-sectional views after performing an ashing process to the photoresist in FIGS. 52A to 52C;

FIGS. 54A to 54C are cross-sectional views after performing an etching process to the structure in FIGS. 53A to 53C; and FIGS. 55A to 55C are cross-sectional view after peeling off the photoresist in FIGS. 54A to 54C.

DETAILED DESCRIPTION

Hereinafter, the embodiments of the invention will be described in detail with reference to the accompanying drawings so that the objects, technical solutions and advantages of the embodiments of the invention will become more apparent. It should be noted that the embodiments described below merely are a portion of but not all of the embodiments of the invention, and thus various modifications, combinations and alterations may be made on basis of the described embodiments without departing from the spirit and scope of the invention.

For the purpose of describing a method of fabricating an array substrate of an FFS type TFT-LCD according to an embodiment of the invention more clearly, firstly, the basic structure of the FFS type TFT-LCD is described with reference to FIGS. 1 and 2A to 2C.

Figure 1:
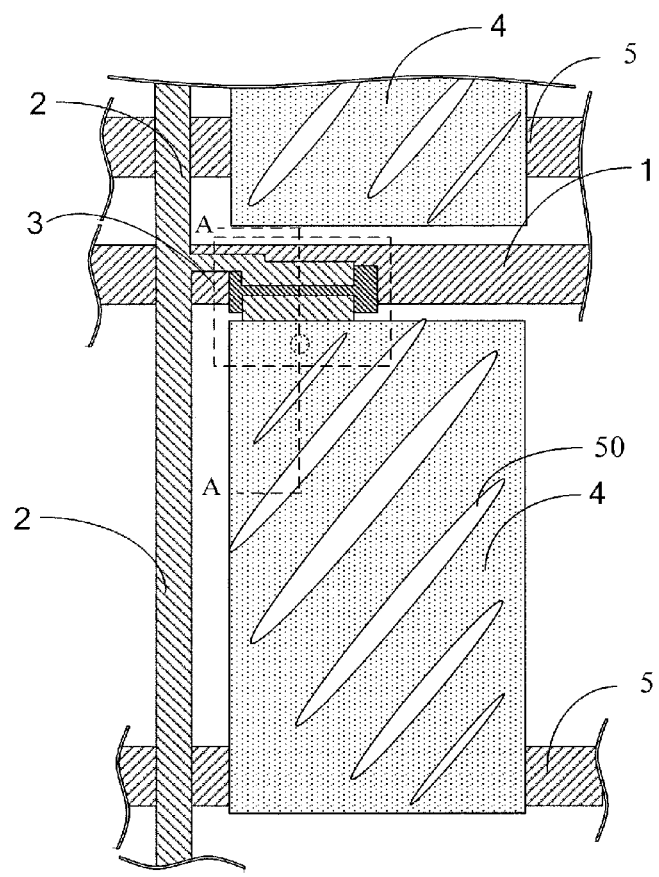
FIG. 1 is a plan schematic diagram showing an array substrate of FFS type TFT LCD.

FIG. 1 is a plan schematic diagram showing an array substrate of the FFS type TFT-LCD. As shown in FIG. 1, the array substrate comprises gate lines 1, data lines 2, thin film transistors (TFTs) 3, pixel electrodes 4, common electrode lines 50 and common electrode lines 5. The gate lines 1 are disposed laterally on a transparent substrate, the data lines 2 are disposed longitudinally on the transparent substrate, and the TFTs 3 are disposed on the positions of the gate lines 1 and the data lines 2 intersecting. The TFTs 3 are active switching elements. The pixel electrode 4 is a slit electrode. The common electrode 50 is located below the pixel electrode 4 and overlaps with the pixel electrode 4 partly so that the common electrode 50 and the pixel electrode 4 can form an electric field for driving the liquid crystal. The common electrode line 5 is connected to the common electrode 50. It should be noted that, in FIG. 1, what the reference numeral "50" indicates is the plate-like common electrode below the slits rather than the strip slits.

Figure 2A:
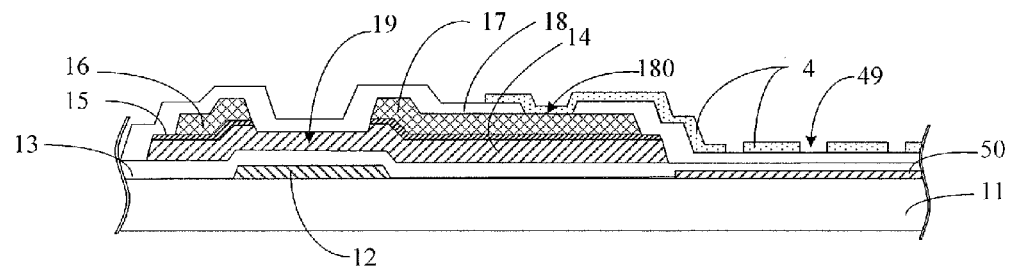
FIG. 2A is a cross-sectional view taken along a line of A-A, showing a cross-sectional view of a pixel region.

FIGS. 2A to 2C are cross-sectional views of the array substrate of the FFS type TFT-LCD. In the figures, FIG. 2A is a cross-sectional view taken along a line A-A, showing a cross section structure of a pixel part of the array substrate. As shown in FIG. 2A, specifically, the array substrate can comprise: a transparent substrate 11, the common electrode 50, a gate electrode 12, a gate insulating layer 13, a semiconductor layer 14, an impurity-doped semiconductor layer 15, a source electrode 16, a drain electrode 17 and a passivation layer 18. The gate electrode 12 and the gate line 1 are formed integrally, the source electrode 16 and the data line 2 are formed integrally, and the drain electrode 17 and the pixel electrode 4 are connected typically by via holes in the passivation layer. When a turning-on signal is input to the gate line 1, the active layer (the semiconductor layer 14 and the impurity-doped semiconductor 15) become electrically conductive, thus a data signal over the data line 2 can be transmitted from the source electrode 16 through the TFT channel 19 to the drain electrode 17, and is input to the pixel electrode 4. After receiving of the signal, the pixel electrode 4 together with the plate-like common electrode 50 can generate an electric field for driving the liquid crystal to rotate. Since the pixel electrode 4 has slits 49, a horizontal field is generated between the pixel electrode 4 and the common electrode 50.

FIG. 2B is a cross-sectional view of the data line in a PAD region of the array substrate of the FFS type TFT-LCD; and FIG. 2C is a cross-sectional view of the gate line in the PAD region of the array substrate of the FFS type TFT-LCD. The PAD region is a press bonding region, that is, a region for press bonding the signal lines such as the gate line, the data line, the common electrode line and the like to wires of an external driving circuit board. The PAD region is located on one or adjacent two of four sides of the array substrate. In order to connect electrically the wires to the signal lines, it is necessary that the signal lines in the PAD region is not covered by any insulating layer. It is clear from FIGS. 2B and 2C, both the data line 2 and the gate line 1 in the PAD region are opened with connection holes 181 and 182. In FIG. 2B, the reference numeral 700 indicates a structure which is a transparent conductive layer formed at the same time as the pixel electrode is formed by etching a transparent conductive film and is conductive electrically, the reference numerals 300 and 400 indicate the structure which is formed when the impurity-doped semiconductor layer and the semiconductor layer are etched and does not affect communication of the data line 2. As such, the external wires can be bonded directly to the transparent conductive layer 700 shown in FIGS. 2B and 2C so as to realize the connection between the array substrate and the driving circuit board. Similarly, the common electrode line is opened with a connection hole so as to be connected to external wires, the structure of which is essentially identical to that shown in FIG. 2C and is not shown.

However, in the method for manufacturing the array substrate of the above FFS type TFT-LCD, five patterning processes are required, which results in high cost and low market competitive power. In addition, in the above step 3, the entire substrate is required to be etched two times, generally, by employing wet etching, so as to form the TFT channel, the source channel and the drain channel. During the wet etching, the substrate is immersed into the etching solution so as to remove the portions, which are not covered by the photoresist and can be etched by the etching solution. When the TFT channel are wet etched, it is necessary to control etching parameters, and generally to control etching time. However, since errors may be present in the process, over-etching of the TFT channel often occurs. Such over-etching may cause deficiencies which can not be ignored for the TFT channel important to the array substrate, and result in widening of the TFT channel or damages of the TFT channel. It would disadvantageously affect the whole property of the liquid crystal display device and the yield. Therefore, a further improvement needs to be made.

FIG. 3 is a flow diagram showing a method for manufacturing an array substrate of the FFS type TFT-LCD according to a first embodiment of the invention. As shown in FIG. 3, the method for manufacturing the array substrate of the FFS type TFT-LCD according to the first embodiment of the invention comprises:

Step 1: forming a first transparent conductive film, a first metal film and an impurity-doped semiconductor film on a transparent substrate sequentially, then patterning the stack of the first transparent conductive film, the first metal film and the impurity-doped semiconductor film so as to form patterns including source electrodes, drain electrodes, data lines and pixel electrodes;

Step 2: forming a semiconductor film, patterning the semiconductor film so as to form a pattern of the impurity-doped semiconductor layer and a pattern of the semiconductor layer including TFT channels;

Step 3: depositing an insulating film and a second metal film, patterning the insulating film and the second metal film so as to form patterns including connection holes for the data lines in the PAD region, gate lines, gate electrodes and common electrode lines;

Step 4: forming a second transparent conductive film, and patterning the second transparent conductive film so as to form patterns including the common electrode.

In the method for manufacturing the array substrate of the FFS type TFT-LCD according to the embodiment of the invention, the array substrate of the FFS type TFT-LCD is fabricated by using four patterning processes. As compared with the prior art, the number of the processes is reduced so that the cost is reduced and the market competitive power is improved.

In the following, the method for manufacturing the array substrate of the FFS type TFT-LCD according to the first embodiment of the invention is described in details with reference to FIGS. 4A to 23C.

Figures 4A, 4B, 4C:
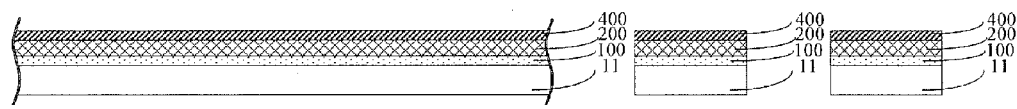

Firstly, a first patterning process of the method for manufacturing the array substrate of the FFS type TFT-LCD according to the first embodiment of the invention is described in details with reference to FIGS. 4A to 9C. As shown in FIGS. 4A to 9C, the first patterning process of the method for manufacturing the array substrate of the FFS type TFT-LCD according to the first embodiment of the invention comprises the following steps:

Step 11: depositing a first transparent conductive film 100, a first metal film 200 and an impurity-doped semiconductor film 400 on a transparent substrate 11 sequentially, as shown in FIGS. 4A to 4C.

The first transparent conductive film 100, the first metal film 200 and the impurity-doped semiconductor film 400 can be deposited sequentially on the transparent substrate 11 (for example, a glass substrate or a silica substrate) by using a plasma enhanced chemical vapor deposition (PECVD), magnetism controlled sputter, thermal evaporation or the other film-forming method. The first transparent conductive film 100 can be made of transparent conductive material such as ITO, IZO or the like. The firs metal film 200 can be a single layer film of a metal such as Molybdenum, Aluminum, Neodymium and Aluminum alloy, Tungsten, Chromium, Copper or the like, or multiple layers film by depositing the above metals in layers.

Step 12: applying photoresist 1000 on the impurity-doped semiconductor film 400 of the structure in FIGS. 4A to 4C, and performing an exposing and developing process with respect to the photoresist by using a prepared mask. The mask used in this step is a dual tone mask (for example, a half tone mask or a gray tone mask). The dual tone mask can be divided into a transparent region, a semi-transparent region and an opaque region according to the transmission ratio or intensity of light. After performing an exposure process by using this mask, the photoresist 100 is formed with an unexposed region, a partially exposed region and a totally exposed region. Then, after performing a development process, the photoresist in the totally exposed region is washed out by a solution; for the photoresist in the partially exposed region, the upper layer is exposed and then washed out, thus the lower layer photoresist is left so that the thickness of the photoresist is decreased; the thickness of the photoresist in the unexposed region remains. In the photoresist 1000 in this step, the unexposed region corresponds to the regions of the data lines 2 (see FIG. 1), the source electrodes and the drain electrodes of the array substrate; the partially exposed region corresponds to the region of the pixel electrodes 4 (see FIG. 1) of the array substrate, and the totally exposed region corresponds to the other regions of the array substrate, as shown in FIGS. 5A to 5C.

Figures 5A, 5B, 5C:
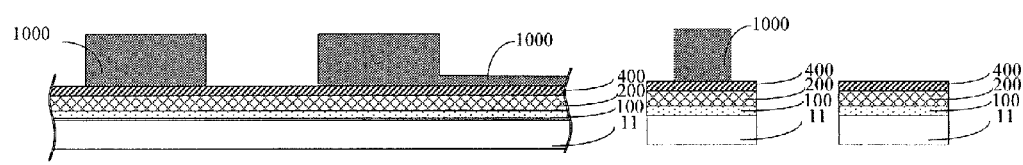
FIGS. 5A to 5C are cross-sectional views after performing exposure and development processes to the structure in FIGS. 4A to 4C applied with a photoresist.

Step 13: performing an etching process to the structure in FIGS. 5A to 5C to remove the impurity-doped semiconductor film 400, the first metal film 200 and the first transparent conductive film 100 in the totally exposed region and form patterns including the data lines 2 and the pixel electrodes 4. The etching process in this step can comprise a three-stage etching. The first stage is to etch the impurity-doped semiconductor film 400 by using a solution for etching the impurity-doped semiconductor material. The second stage is to etch the first metal film 200 to obtain patterns of the data lines 2 by using a solution (for example, a mixture of phosphorous acid and nitric acid) for etching the metal material. The third stage is to remove the first transparent conductive film 100 to form the pattern of the pixel electrodes 4 by using a solution for etching ITO or IZO. In actual producing, the pattern having a large area can be etched by using a wet etching process. The so-called wet etching is to immerse the object to be etched into an etching solution so that the exposed portions of the object to be etched are etched away by the etching solution. The regions covered by the photoresist, i.e., the partially exposed region and the unexposed region, are not etched due to protection of the photoresist. The films in the totally exposed region are etched away because of the direct contact with the etching solution. The desired patterns are formed by the residual films.

Figures 6A, 6B, 6C:
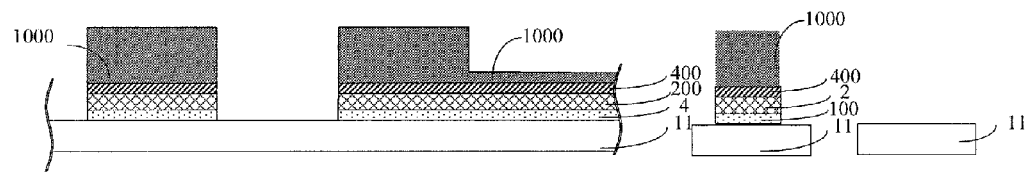
FIGS. 6A to 6C are cross-sectional views after performing an etching process with respect to the structure in FIGS. 5A to 5C.
Figures 7A, 7B, 7C:
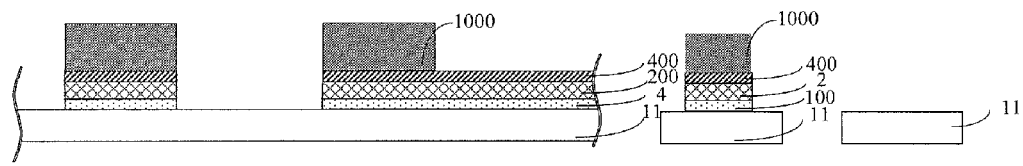
FIGS. 7A to 7C are cross-sectional views after performing an ashing process with respect to the photoresist in FIGS. 6A to 6C.

Step 14: performing an ashing process to the photoresist 100 in FIGS. 6A to 6C to expose the impurity-doped semiconductor film 400 in the partially exposed region, as shown in FIGS. 7A to 7C. The ashing process has a function of removing a certain thickness of the photoresist. In this step, the removed photoresist has the same thickness as the thickness of the photoresist remained in the partially-exposed region in the step 12. That is, after the ashing process, the photoresist remains in the unexposed region, and no photoresist is left in other regions.

Figures 8A, 8B, 8C:
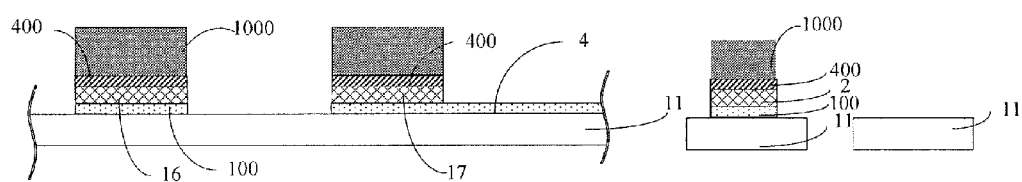
FIGS. 8A to 8C are cross-sectional views after performing an etching process with respect to the structure in FIGS. 7A to 7C.

Step 15: performing an etching process to the structure in FIGS. 7A to 7C to remove the impurity-doped semiconductor 400 and the first metal film 200 in the partially exposed region and form patterns including the source electrode 16 and the drain electrode 17, as shown in FIGS. 8A to 8C. The etching process in this step can comprise two-stage etching. The impurity-doped semiconductor film 400 is firstly etched and then the first metal film 200 is etched so that the source electrode 16 and the drain electrode 17 are formed and the pixel electrode 4 is exposed.

Figures 9A, 9B, 9C:
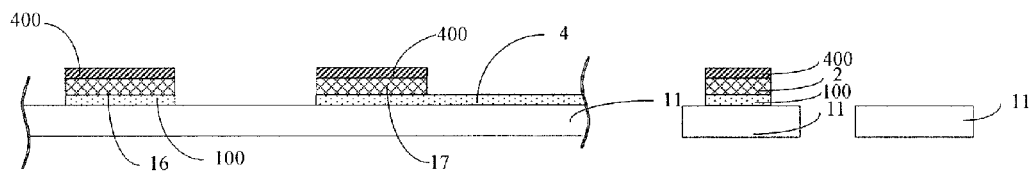
FIGS. 9A to 9C are cross-sectional views after peeling off the photoresist in FIGS. 8A to 8C.

Step 16: removing the residual photoresist 1000 in FIGS. 8A to 8C, as shown in FIGS. 9A to 9C.

Figures 10A, 10B, 10C:
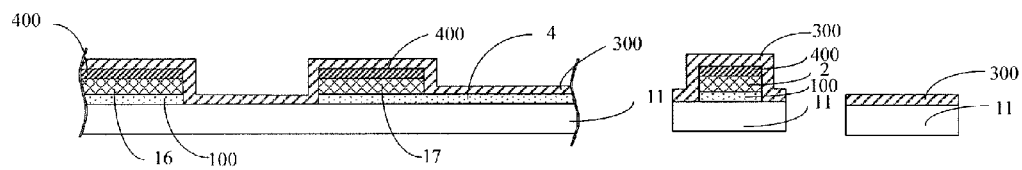
FIGS. 10A to 10C are cross-sectional views after depositing a semiconductor film on the structure in FIGS. 9A to 9C.

In the following, a second patterning process of the method for manufacturing the array substrate of the FFS type TFT-LCD according to the first embodiment of the invention is described in details with reference to FIGS. 10A to 13C. The second patterning process can comprise the following steps:

Step 21: depositing a semiconductor film 300 on the structure in FIGS. 9A to 9C, as shown in FIGS. 10A to 10C.

Figures 11A, 11B, 11C:
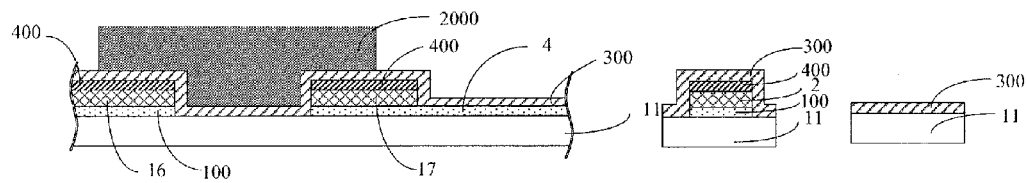
FIGS. 11A to 11C are cross-sectional views after performing exposure and development processes to the structure in FIGS. 10A to 10C applied with a photoresist.

Step 22: applying photoresist 2000 on the semiconductor film 400 in FIGS. 10A to 10C, and performing an exposing and developing process with respect to the photoresist by using a prepared mask so that the photoresist 2000 includes a totally exposed region and an unexposed region. The unexposed region corresponds to the region of the semiconductor layer 14 on the array substrate (see FIG. 2), and the totally exposed region corresponds to the other regions, as shown in FIGS. 11A to 11C. The mask used in this step is a normal mask, which includes a transparent region and an opaque region.

Figures 12A, 12B, 12C:
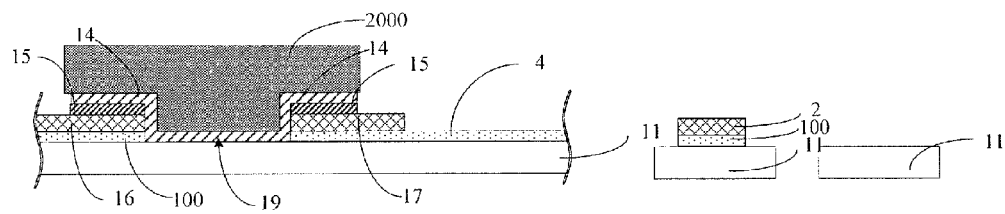
FIGS. 12A to 12C are cross-sectional views after performing an etching process with respect to the structure in FIGS. 11A to 11C.

Step 23: performing an etching process to the structure in FIGS. 11A to 11C to remove the semiconductor film 300 in the totally exposed region and form the semiconductor layer 14 and the impurity-doped semiconductor 15, as shown in FIGS. 12A to 12C. In this step, the impurity-doped semiconductor film 400 can be etched together with the semiconductor film 300 is etched. In this step, the TFT channel is formed naturally without any etching. Therefore, it is possible to prevent the problem of generating over-etching defects when the impurity-doped semiconductor film is etched so as to form the TFT channel that occurs in the prior art.

Figures 13A, 13B, 13C:
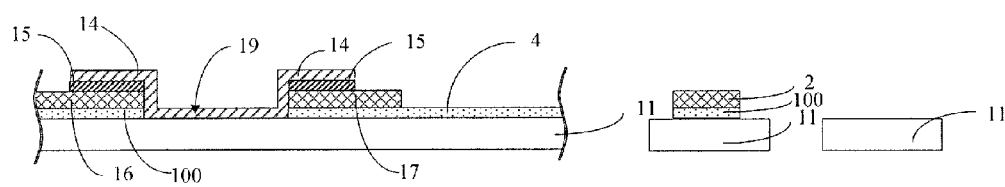
FIGS. 13A to 13C are cross-sectional views after peeling off the photoresist in FIGS. 12A to 12C.

Step 24: removing the residual photoresist 2000 in FIGS. 12A to 12C, as shown in FIGS. 13A to 13C.

Figures 14A, 14B, 14C:
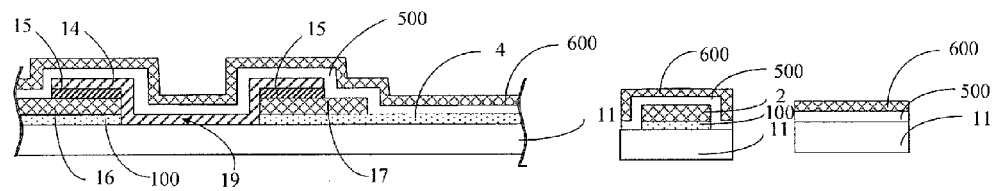
FIGS. 14A to 14C are cross-sectional views after depositing an insulating film and a second metal film on the structure in FIGS. 13A to 13C.

In the following, a third patterning process of the method for manufacturing the array substrate of the FFS type TFT-LCD according to the first embodiment of the invention is described in details with reference to FIGS. 14A to 19C. The third patterning process can comprise the following steps:

Step 31: depositing an insulating film 500 and a second metal film 600 on the structure in FIGS. 13A to 13C, as shown in FIGS. 14A to 14C.

Step 32: applying photoresist 3000 on the second metal film in FIGS. 14A to 14C, and performing an exposing and developing process with respect to the photoresist 3000 by using a prepared mask so that the photoresist 3000 includes an unexposed region, a partially exposed region and a totally exposed region. The unexposed region corresponds to the regions of the gate electrode 12, the gate line 1 and the common electrode line 5 of the array substrate, the totally exposed region corresponds to the region of the data line 2 in the PAD region of the array substrate, and the partially exposed region corresponds to the other regions of the array substrate, as shown in FIGS. 15A to 15C.

Figures 15A, 15B, 15C:
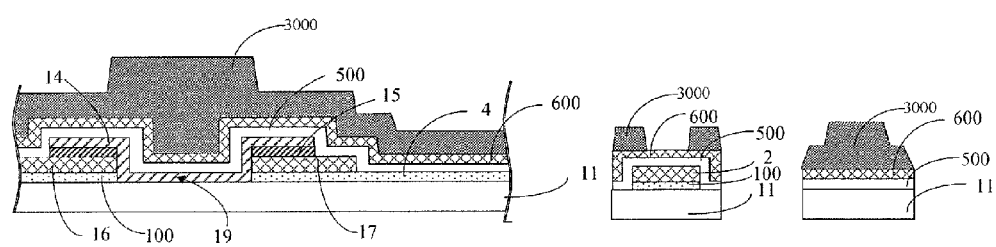
FIGS. 15A to 15C are cross-sectional views after performing exposure and development processes to the structure in FIGS. 14A to 14C applied with a photoresist.
Figures 16A, 16B, 16C:
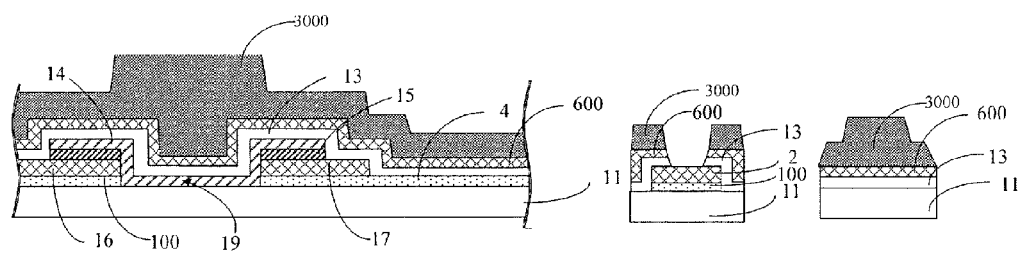
FIGS. 16A to 16C are cross-sectional views after performing an etching process with respect to the structure in FIGS. 15A to 15C.

Step 33: performing an etching process with respect to the structure in FIGS. 15A to 15C to remove the second metal film 600 and the insulating film 500 in the totally exposed region and form patterns including connection holes for the data lines in the PAD region and the gate insulating layer 13, as shown in FIGS. 16A to 16C.

Figures 17A, 17B, 17C:
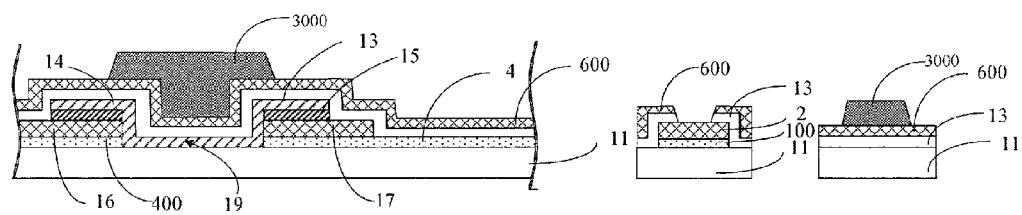
FIGS. 17A to 17C are cross-sectional views after performing an ashing process with respect to the photoresist in FIGS. 16A to 16C.

Step 34: performing an ashing process with respect to the photoresist 3000 in FIGS. 16A to 16C to expose the second metal film 600 in the partially exposed region and leave a certain thickness of the photoresist in the unexposed region, as shown in FIGS. 17A to 17C.

Figures 18A, 18B, 18C:
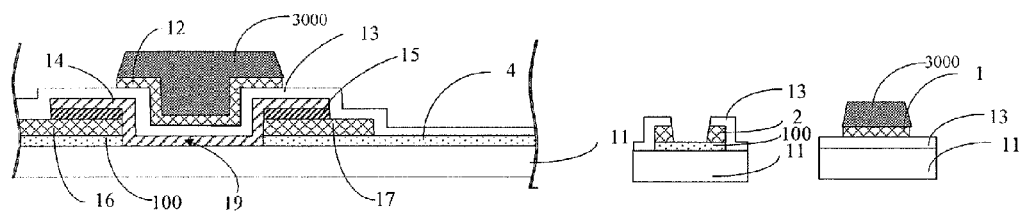
FIGS. 18A to 18C are cross-sectional views after performing an etching process with respect to the structure in FIGS. 17A to 17C.

Step 35: performing an etching process with respect to the structure in FIGS. 17A to 17C to remove the second metal film 600 in the partially exposed region and form patterns including the common electrode line 5 (see FIG. 1), the gate electrode 12 and the gate line 1, as shown in FIGS. 18A to 18C.

Figures 19A, 19B, 19C:
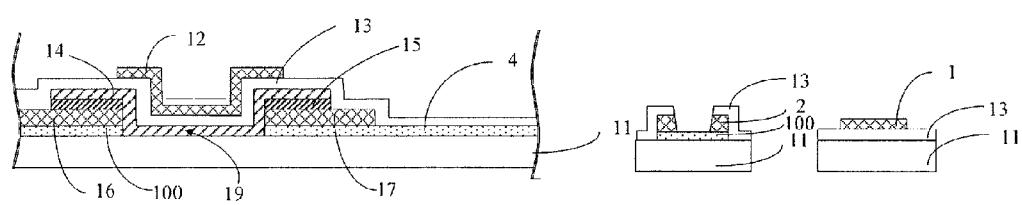
FIGS. 19A to 19C are cross-sectional views after peeling off the photoresist in FIGS. 18A to 18C.

Step 36: removing the residual photoresist 3000 in FIGS. 18A to 18C, as shown in FIGS. 19A to 19C.

Figures 20A, 20B, 20C:
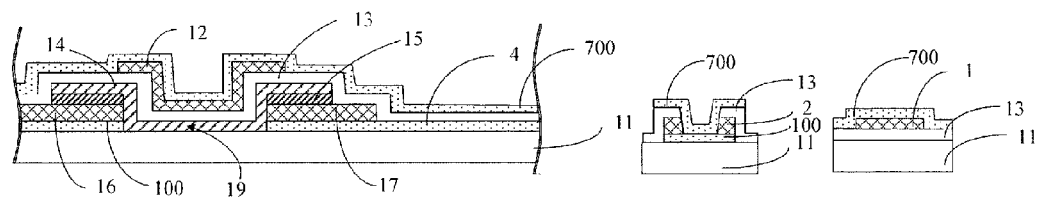
FIGS. 20A to 20C are cross-sectional views after depositing a second transparent conductive film on the structure in FIGS. 19A to 19C.

In the following, a fourth patterning process of the method for manufacturing the array substrate of the FFS type TFT-LCD according to the first embodiment of the invention is described in details with reference to FIGS. 20A to 23C. The fourth patterning process can comprise the following steps:

Step 41: depositing a second transparent conductive film 700 on the structure in FIGS. 19A to 19C, as shown in FIGS. 20A to 20C.

Step 42: applying photoresist 4000 on the second transparent conductive film 700 in FIGS. 20A to 20C, and performing an exposing and developing process with respect to the photoresist 4000 by using a prepared mask so that the photoresist 4000 is formed with a totally exposed region and an unexposed region. The unexposed region corresponds to regions of the common electrode 50 (see FIG. 1), the data line 2 in the PAD region and the gate line 1 in the PAD region on the array substrate, and the totally exposed region corresponds to the other regions, as shown in FIGS. 21A to 21C.

Figures 21A, 21B, 21C:
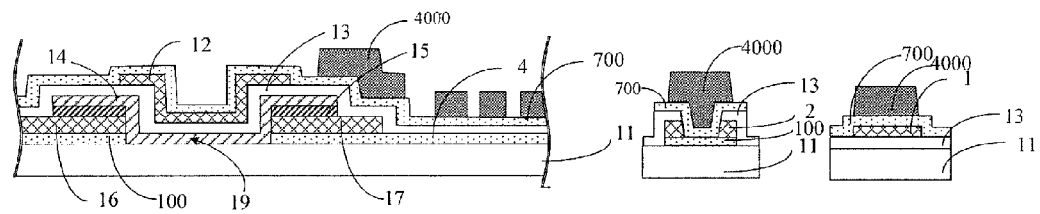
FIGS. 21A to 21C are cross-sectional views after performing exposure and development processes to the structure in FIGS. 20A to 20C applied with a photoresist.
Figures 22A, 22B, 22C:
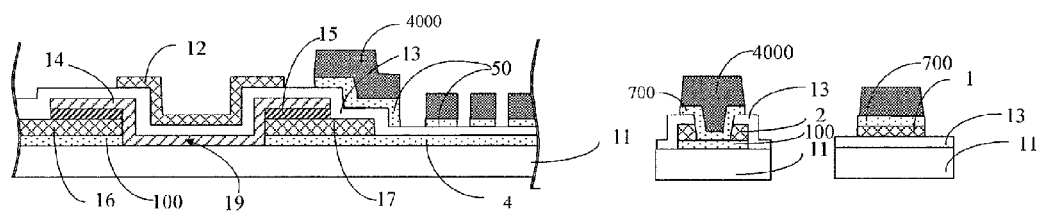
FIGS. 22A to 22C are cross-sectional views after performing an etching process with respect to the structure in FIGS. 21A to 21C.

Step 44: performing an etching process with respect to the structure in FIGS. 21A to 21C to remove the second transparent conductive film 700 in the totally exposed region and form patterns including the common electrode 50, as shown in FIGS. 22A to 22C.

Figures 23A, 23B, 23C:
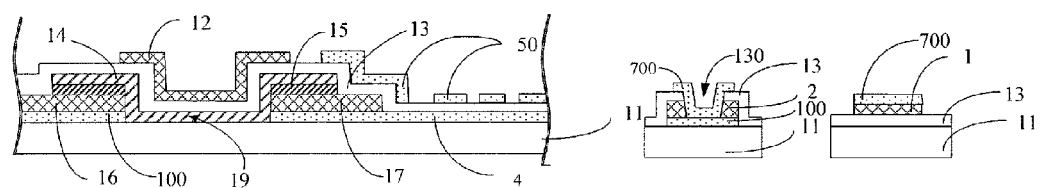
FIGS. 23A to 23C are cross-sectional views after peeling off the photoresist in FIGS. 22A to 22C.

Step 45: removing the residual photoresist 4000 in FIGS. 22A to 22C, as shown in FIGS. 23A to 23C.

In the method for manufacturing the array substrate of the FFS type TFT-LCD according to the first embodiment of the invention, not only one patterning step is reduced as compared with the five patterning processes in the prior art, but also it is used to firstly pattern the impurity-doped semiconductor layer and then pattern the semiconductor layer, which prevent the TFT channel from being over-etched and thus the quality of the liquid crystal display device can be ensured.

Figure 24:
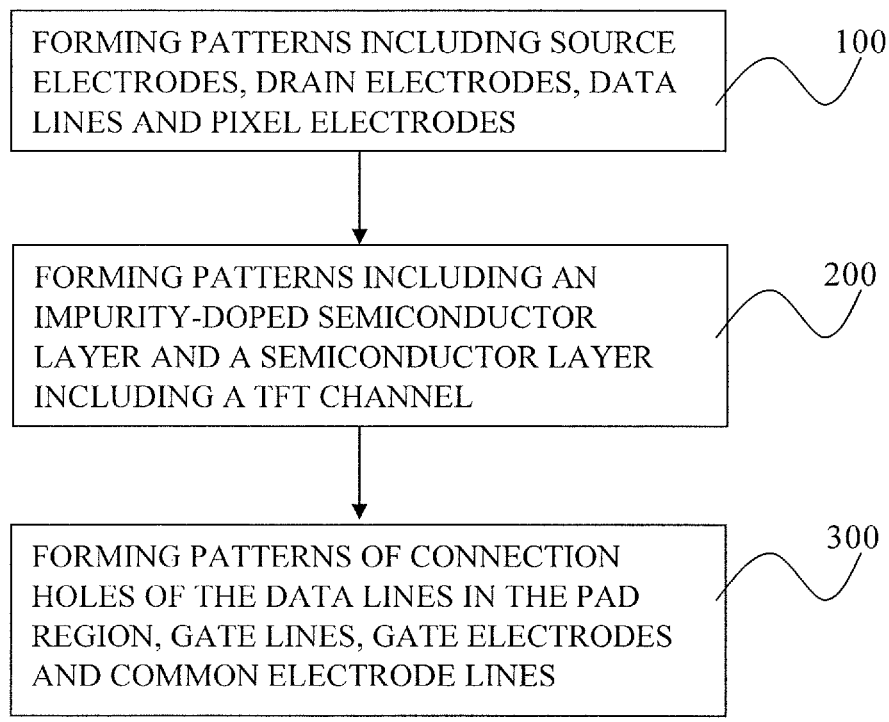
FIG. 24 is a flow diagram of manufacturing an array substrate of an FFS type TFT-LCD according to a second embodiment of the invention.

FIG. 24 is a flow diagram showing a method for manufacturing an array substrate of the FFS type TFT-LCD according to a second embodiment of the invention. As shown in FIG. 24, the method for manufacturing the array substrate of the FFS type TFT-LCD according to the second embodiment of the invention comprises:

Step 1: forming a first transparent conductive film, a first metal film and an impurity-doped semiconductor film on a transparent substrate sequentially, then patterning the stack of the first transparent conductive film, the first metal film and the impurity-doped semiconductor film so as to form patterns including source electrodes, drain electrodes, data lines and pixel electrodes;

Step 2: depositing a semiconductor film, patterning the semiconductor film and the impurity semiconductor film so as to form a pattern of the impurity-doped semiconductor layer and a pattern of the semiconductor layer including TFT channels;

Step 3': depositing an insulating film and a second metal film, patterning the insulating film and the second metal film, then depositing a second transparent conductive film and performing a lifting-off process and an etching process, so as to form patterns including connection holes for the data lines in the PAD region, gate lines, gate electrodes and common electrode lines.

In the method for manufacturing the array substrate of the FFS type TFT-LCD according to this embodiment of the invention, the array substrate of the FFS type TFT-LCD is fabricated by using three patterning processes. As compared with the first embodiment, the number of the processes is further reduced so that the cost is reduced and the market competitive power can be improved.

In the following, the method for manufacturing the array substrate of the FFS type TFT-LCD according to the second embodiment of the invention is described in details with reference to FIGS. 25A to 33C. Since the first patterning process and the second patterning process in the second embodiment are identical to those in the first embodiment, and the description thereof is omitted.

The third patterning process of the method for manufacturing the array substrate of the FFS type TFT-LCD according to the second embodiment of the invention is described in details with reference to FIGS. 25A to 33C. The third patterning process can comprise the following steps:

Step 31': depositing an insulating film 500 and a second metal film 600 sequentially on the structure in FIGS. 13A to 13C, as shown in FIGS. 25A to 25C.

Step 32': applying photoresist 3000' on the second metal film 600 in FIGS. 25A to 25C, and performing an exposing and developing process with respect to the photoresist 3000' by using a prepared mask so that the photoresist 3000' includes an unexposed region, a first partially exposed region, a second partially exposed region and a totally exposed region. The photoresist in the second partially exposed region has a thickness larger than that in the first partially exposed region after developing. The totally exposed region corresponds to a region of the data line 2 in the PAD region of the array substrate, the first partially exposed region corresponds to a region of the common electrode 50 on the array substrate, the second partially exposed region corresponds to regions of the gate line 1 and the gate electrode 12 of the array substrate, and the unexposed region corresponds to the other regions of the array substrate, as shown in FIGS. 26A to 26C. The mask used in this step is a three-tone mask including a transparent region, a first semi-transparent region, a second semi-transparent region and an opaque region. These regions are divided based on the intensity or level of the transmitted light. The intensity of the light transmitted by the first semi-transparent region is larger than the light of the light transmitted by the second semi-transparent region.

Figures 27A, 27B, 27C:
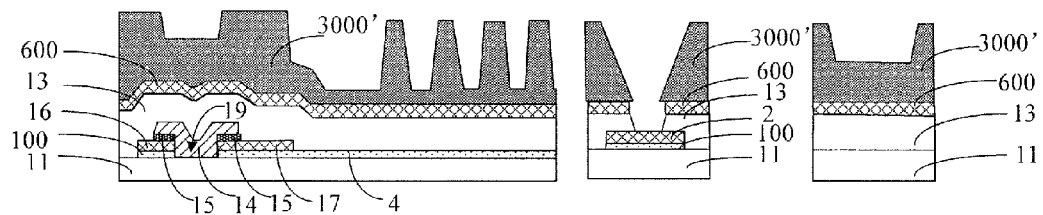
FIGS. 27A to 27C are cross-sectional views after performing an etching process with respect to the structure in FIGS. 26A to 26C.

Step 33': performing an etching process with respect to the structure in FIGS. 26A to 26C to remove the insulating film 500 and the second metal film 600 in the totally exposed region and form patterns including connection holes for the data lines in the PAD region and the gate insulating layer 13, as shown in FIGS. 27A to 27C. The etching process in this step can be divided into two stages of etching, i.e., the stage of etching the second metal film 600 and the stage of etching the insulating film 500.

Figures 28A, 28B, 28C:
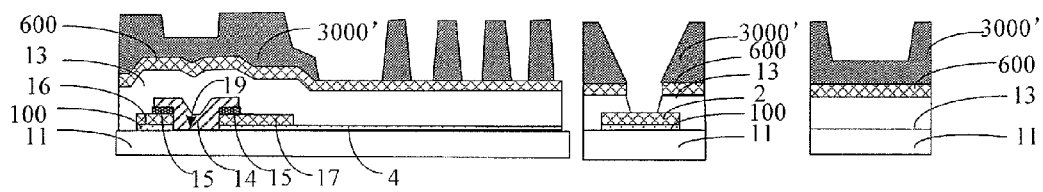
FIGS. 28A to 28C are cross-sectional views after performing an ashing process with respect to the photoresist in FIGS. 27A to 27C.

Step 34': performing an ashing process with respect to the photoresist 3000' in FIGS. 27A to 27C to expose the second metal film 600 in the first partially exposed region and leave a certain thickness of the photoresist in the second partially exposed region and in the unexposed region, as shown in FIGS. 28A to 28C.

Figures 29A, 29B, 29C:
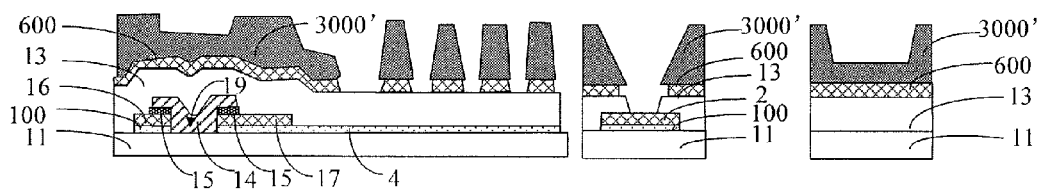

Step 35': performing an etching process with respect to the structure in FIGS. 28A to 28C to remove the second metal film 600 in the first partially exposed region, as shown in FIGS. 29A to 29C.

Figures 30A, 30B, 30C:
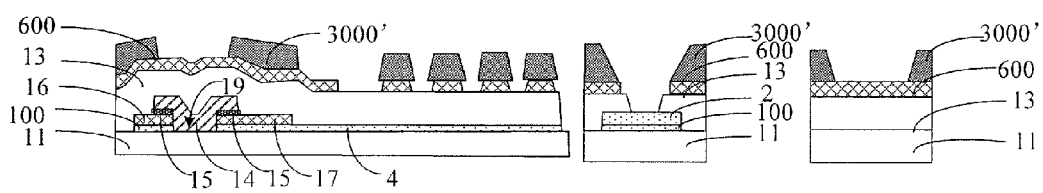
FIGS. 30A to 30C are cross-sectional views after performing an ashing process with respect to the photoresist in FIGS. 29 to 29C.

Step 36': performing an ashing process with respect to the photoresist 3000' in FIGS. 29A to 29C to expose the second metal film 600 in the second partially exposed region and leave a certain thickness of the photoresist in the unexposed region, as shown in FIGS. 30A to 30C.

Figures 31A, 31B, 31C:
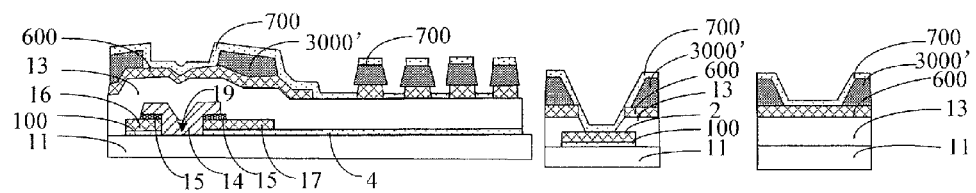
FIGS. 31A to 31C are cross-sectional views after depositing a second transparent conductive film on the structure in FIGS. 30A to 30C.

Step 37': depositing a second transparent conductive film 700 on the structure shown in FIGS. 30A to 30C, as shown in FIGS. 31A to 31C.

Figures 32A, 32B, 32C:
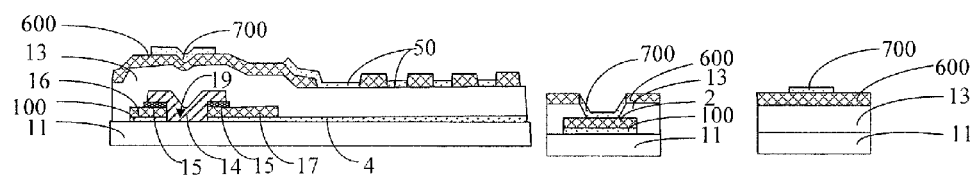
FIGS. 32A to 32C are cross-sectional views after performing a lifting-off process with respect to the structure in FIGS. 31A to 31C.
Figures 33A, 33B, 33C:
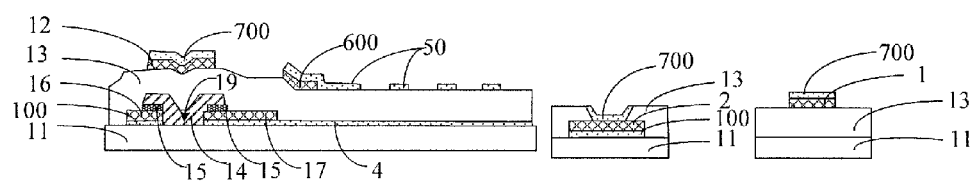
FIGS. 33A to 33C are cross-sectional views after performing an etching process with respect to the structure in FIGS. 32A to 32C.

Step 38': performing a lifting-off process with respect to the structure in FIGS. 31A to 31C to remove the photoresist along with the second transparent conductive film 700 deposited on the photoresist 3000' and form patterns of including the common electrodes 50, as shown in FIGS. 32A to 32C.

Step 39': performing an etching process with respect to the structure in FIGS. 32A to 32C to remove the second metal film 600 in the unexposed region and form patterns including the gate lines 1 and the gate electrodes 12.

In the method for manufacturing the array substrate of the FFS type TFT-LCD according to this embodiment of the invention, the array substrate of the FFS type TFT-LCD is fabricated by using three patterning processes. As compared with the first embodiment, the number of the processes is further reduced so that the cost is reduced and the market competitive power is improved.

Figure 34:
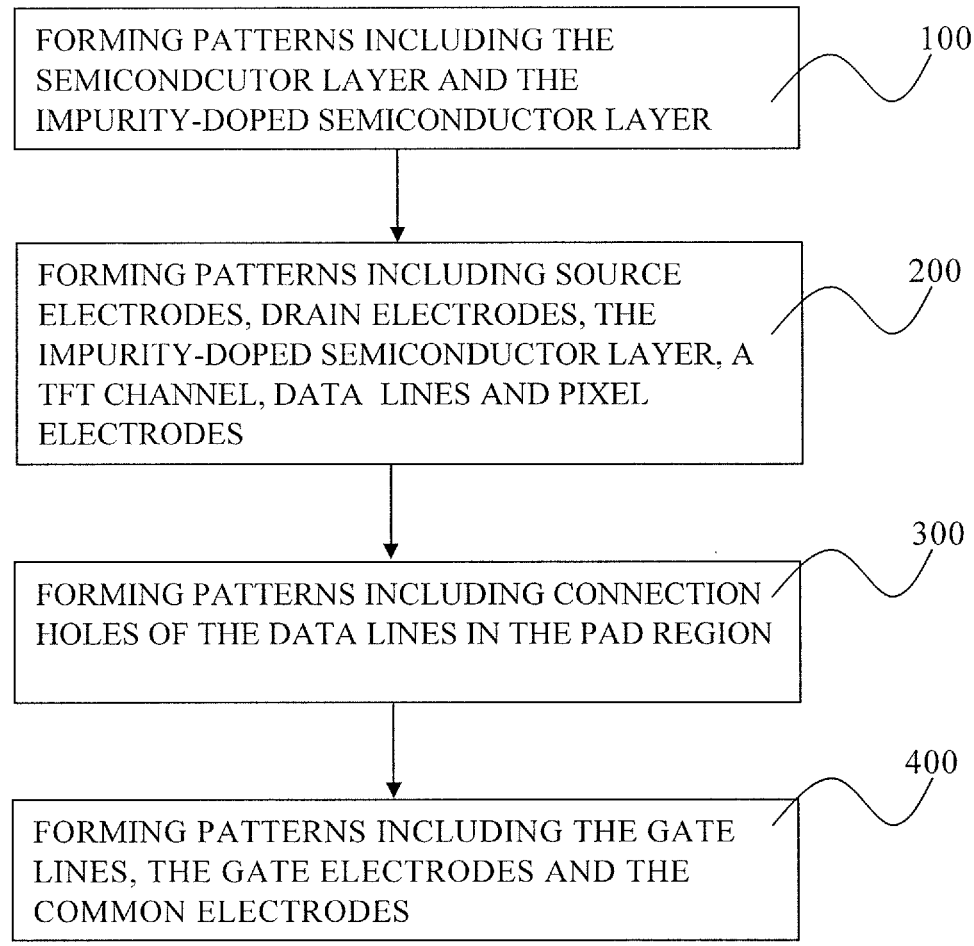
FIG. 34 is a flow diagram of manufacturing an array substrate of an FFS type TFT-LCD according to a third embodiment of the invention.

FIG. 34 is a flow diagram showing a method for manufacturing an array substrate of the FFS type TFT-LCD according to a third embodiment of the invention. As shown in FIG. 34, the method for manufacturing the array substrate of the FFS type TFT-LCD according to the third embodiment of the invention comprises:

Step 100: forming a semiconductor film and an impurity-doped semiconductor film on a transparent substrate sequentially, then patterning the stack of the semiconductor film and the impurity-doped semiconductor film so as to form patterns including a semiconductor layer and an impurity-doped semiconductor layer;

Step 200: forming a first transparent conductive film and a first metal film, and patterning the first transparent conductive film and the first metal film to form patterns including source electrodes, drain electrodes, the impurity-doped semiconductor layer, TFT channels, data lines and pixel electrodes;

Step 300: depositing an insulating film and patterning the insulating film so as to form patterns including connection holes for the data lines in the PAD region, gate lines, gate electrodes and common electrodes;

Step 400: forming a second transparent conductive film and a second metal film, patterning the second transparent conductive film and the second metal film so as to form patterns including gate lines, gate electrodes and common electrodes.

In the method for manufacturing the array substrate of the FFS type TFT-LCD according to the third embodiment of the invention, the array substrate of the FFS type TFT-LCD is fabricated by using four patterning processes. As compared with the prior art, the number of the processes is further reduced so that the cost is reduced and the market competitive power is improved.

In the following, the method for manufacturing the array substrate of the FFS type TFT-LCD according to the third embodiment of the invention is described in details with reference to FIGS. 35A to 55C.

Figures 35A, 35B, 35C:
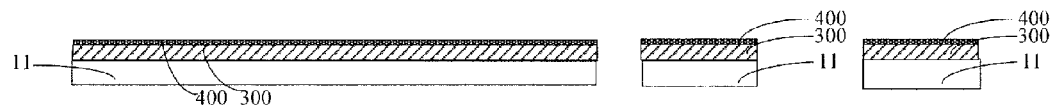

Firstly, a first patterning process of the method for manufacturing the array substrate of the FFS type TFT-LCD according to the third embodiment of the invention is described in details with reference to FIGS. 35A to 38C. The first patterning process can comprise the following steps:

Step 1100: depositing a semiconductor film 300 and an impurity-doped semiconductor film 400 on a transparent substrate 11 sequentially, as shown in FIGS. 35A to 35C.

Step 1200: applying photoresist 5000 on the impurity-doped semiconductor film 400 in FIGS. 35A to 35C, and performing an exposing and developing process with respect to the photoresist 5000 by using a prepared mask so that the photoresist includes an unexposed region and a totally exposed region. The unexposed region corresponds to a region of the semiconductor layer 14 of the array substrate, and the totally exposed region corresponds to the other regions of the array substrate, as shown in FIGS. 36A to 36C.

Figures 36A, 36B, 36C:
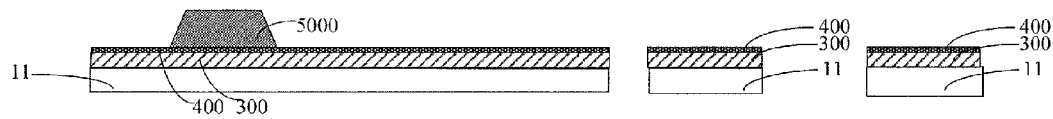
FIGS. 36A to 36C are cross-sectional views after performing exposure and development processes to the structure in FIGS. 35A to 35C applied with a photoresist.
Figures 37A, 37B, 37C:
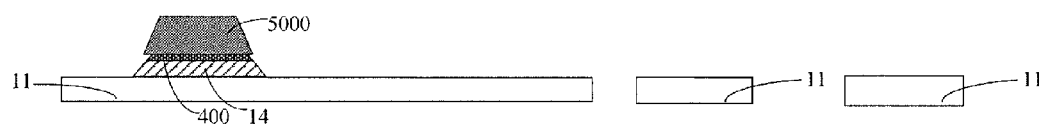
FIGS. 37A to 37C are cross-sectional views after performing an etching process with respect to the structure in FIGS. 36A to 36C.

Step 1300: performing an etching process with respect to the structure in FIGS. 36A to 36C to remove the impurity-doped semiconductor film 400 and the semiconductor film 300 in the totally exposed region and form patterns including the semiconductor layer, as shown in FIGS. 37A to 37C.

Figures 38A, 38B, 38C:
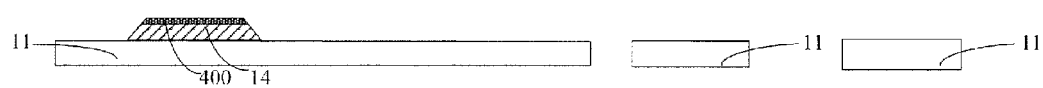
FIGS. 38A to 38C are cross-sectional views after peeling off the photoresist in FIGS. 37A to 37C.

Step 1400: removing the residual photoresist 5000 in FIGS. 37A to 37C, as shown in FIGS. 38A to 38C.

In the step 1100 of the first patterning process in this embodiment, an insulating film can be deposited firstly and patterned together with the semiconductor layer so as to obtain the pattern of the insulating layer formed below the semiconductor layer. The insulating layer can be used to prevent a parasitic capacitance from being produced between the semiconductor layer and the backlight module, which blocks the transmittance of the signal. The insulating film is preferably made of an opaque material such as a mixture of silicon nitride and carbon (the material for fabricating black matrix) or the like. The insulating film also can function as a black matrix.

In the following, a second patterning process of the method for manufacturing the array substrate of the FFS type TFT-LCD according to the third embodiment of the invention is described in details with reference to FIGS. 35A to 38C. The second patterning process can comprise the following steps:

Step 2100: depositing a first transparent conductive film 100 and a first metal film 200 on the structure in FIGS. 38A to 38C, as shown in FIGS. 39A to 39C.

Step 2200: applying photoresist 6000 on the first metal film in FIGS. 39A to 39C, and performing an exposing and developing process with respect to the photoresist 6000 by using a prepared mask so that the photoresist 6000 can include an unexposed region, a partially exposed region and a totally exposed region. The unexposed region corresponds to regions of the data lines 2, the source electrodes 16 and the drain electrodes 17 of the array substrate, the partially exposed region corresponds to regions of the pixel electrodes 4 of the array substrate, and the totally exposed region corresponds to the other regions of the array substrate, as shown in FIGS. 40A to 40C.

Step 2300: performing an etching process with respect to the structure in FIGS. 40A to 40C to remove the first metal film 200 and the first transparent conductive film 100 in the totally exposed region and form patterns including the data lines 2 and the pixel electrodes 4, as shown in FIGS. 41A to 41C.

Step 2400: performing an ashing process with respect to the photoresist 6000 in FIGS. 41A to 41C to expose the first metal film 200 in the partially exposed region and leave a certain thickness of the photoresist in the unexposed region, as shown in FIGS. 42A to 42C.

Step 2500: performing an etching process with respect to the structure in FIGS. 42A to 42C to remove the first metal film 200 and the impurity-doped semiconductor film 400 in the partially exposed region and form patterns including the TFT channels 19, the source electrodes 16 and the drain electrodes 17, as shown in FIGS. 43A to 443C.

Step 2600: removing the residual photoresist 600 in FIGS. 44A to 44C, as shown in FIGS. 45A to 45C.

In the following, a third patterning process of the method for manufacturing the array substrate of the FFS type TFT-LCD according to the second embodiment of the invention is described in details with reference to FIGS. 14A to 19C. The third patterning process can comprise the following steps:

Step 3100: depositing an insulating film 500 on the structure in FIGS. 45A to 45C, as shown in FIGS. 46A to 46C.

Step 3200: applying photoresist 7000 on the insulating film 500 in FIGS. 46A to 46C, and performing an exposing and developing process with respect to the photoresist 7000 by using a prepared mask so that the photoresist 7000 can include an unexposed region and a totally exposed region. The totally exposed region corresponds to the regions of the data lines 2 in the PAD region of the array substrate, and the unexposed region corresponds to the other regions of the array substrate, as shown in FIGS. 47A to 47C.

Step 3300: performing an etching process with respect to the structure in FIGS. 47A to 47C to remove the insulating film 500 in the totally exposed region and form a pattern including the gate insulating layer 13 as shown in FIGS. 48A to 48C.

Step 3400: removing the residual photoresist 7000 in FIGS. 48A to 48C, as shown in FIGS. 49A to 49C.

In the following, a fourth patterning process of the method for manufacturing the array substrate of the FFS type TFT-LCD according to the second embodiment of the invention is described in details with reference to FIGS. 50A to 55C. The fourth patterning process can comprise the following steps:

Step 4100: depositing a second transparent conductive film 700 and a second metal film 600 on the structure in FIGS. 49A to 49C, as shown in FIGS. 50A to 50C.

Step 4200: applying photoresist 8000 on the second metal film 600 in FIGS. 50A to 50C, performing an exposing and developing process with respect to the photoresist 8000 by using a prepared mask so that the photoresist 8000 can include an unexposed region, a partially exposed region and a totally exposed region. The unexposed region corresponds to regions of the gate electrodes 12, the gate lines 1, the common electrode lines 5 and the data lines 2 in the PAD region of the array substrate, the partially exposed region corresponds to a regions of the common electrodes 50 of the array substrate, and the totally exposed region corresponds to the other regions of the array substrate, as shown in FIGS. 51A to 51C.

Step 4300: performing an etching process with respect to the structure in FIGS. 51A to 51C to remove the second metal film 600 and the second transparent conductive film 700 in the totally exposed region and form patterns including the gate lines 1, the gate electrodes 12, the common electrode lines 5, and the common electrodes 50, as shown in FIGS. 52A to 52C.

Step 4400: performing an ashing process with respect to the photoresist 8000 in FIGS. 52A to 52C to expose the second metal film 600 in the partially exposed region, and leave the photoresist having a certain thickness in the unexposed region, as shown in FIGS. 53A to 53C.

Step 4500: performing an etching process with respect to the structure in FIGS. 53A to 53C to remove the second metal film 600 in the partially exposed region and expose the common electrodes 50, as shown in FIGS. 54A to 54C.

Step 4600: removing the residual photoresist FIGS. 54A to 54C, as shown in FIGS. 55A to 55C.

According to the teaching of the second embodiment, it is clear for those skilled in the art to combine the steps 300 and 400 into one patterning process so as to further reduce the number of the processes. As a result, the cost is reduced and the market competitive power is improved.

Positive type photoresist is described as an example above, after developing, the photoresist in the unexposed region is totally left, the photoresist in the totally exposed region is totally removed, and the photoresist in the partially exposed region is partially left. However, the embodiments of the invention are not limited hereto. If negative type photoresist is used, then after developing, the photoresist in the totally exposed region is totally left, the photoresist in the unexposed region is totally removed, and the photoresist in the partially exposed region is partially left.

It should be appreciated that the embodiments described above are intended to illustrate but not limit the present invention. Although the present invention has been described in detail herein with reference to the preferred embodiments, it should be understood by those skilled in the art that the present invention can be modified and some of the technical features can be equivalently substituted without departing from the spirit and scope of the present invention.

What is claimed is:

1. A method for manufacturing an array substrate of a fringe-field switch (FFS) type thin film transistor liquid crystal display (TFT-LCD) comprising the steps of:
   step 1: forming a first transparent conductive film, a first metal film and an impurity-doped semiconductor film on a transparent substrate sequentially, and then patterning the stack of the first transparent conductive film, the first metal film and the impurity-doped semiconductor film so as to faun patterns including source electrodes, drain electrodes, data lines and pixel electrodes;
   step 2: forming a semiconductor film, and patterning the semiconductor film so as to form a pattern of the impurity-doped semiconductor layer and a pattern of the semiconductor layer including TFT channels;
   step 3: depositing an insulating film and a second metal film, and patterning the insulating film and the second metal film so as to form patterns including connection holes of the data lines in a PAD region, gate lines, gate electrodes and common electrode lines; and
   step 4: forming a second transparent conductive film, and patterning the second transparent conductive film so as to form patterns including the common electrode.

2. The method for manufacturing an array substrate of an FFS type TFT-LCD according to claim 1, wherein the step 1 comprises:
   step 11: depositing the first transparent conductive film, the first metal film and the impurity-doped semiconductor film on the transparent substrate sequentially;
   step 12: applying first photoresist on the impurity-doped semiconductor film, and performing an exposing and developing process with respect to the first photoresist by using a prepared mask so that the first photoresist comprises: a photoresist-totally-remaining region corresponding to regions of the data lines, the source electrodes and the drain electrodes of the array substrate, a photoresist-partially-remaining region corresponding to regions of the pixel electrodes of the array substrate and a photoresist-totally-removed region corresponding to the other regions of the array substrate;
   step 13: performing an etching process to remove the impurity-doped semiconductor film, the first metal film and the first transparent conductive film in the photoresist-totally-removed region and form patterns including the data lines and the pixel electrodes;
   step 14: performing an ashing process with respect to the first photoresist to expose the impurity-doped semiconductor film in the photoresist-partially-remaining region and leave the first photoresist having a certain thickness in the photoresist-totally-remaining region;
   step 15: performing an etching process to remove the impurity-doped semiconductor 400 and the first metal film in the photoresist-partially-remaining region and form patterns including the source electrodes and the drain electrodes; and
   step 16: removing the residual first photoresist.

3. The method for manufacturing an array substrate of an FFS type TFT-LCD according to claim 1, wherein the step 2 comprises:
   step 21: depositing the semiconductor film on the structure obtained in the step 1;
   step 22: applying second photoresist on the semiconductor film and performing an exposing and developing process with respect to the second photoresist by using a prepared mask so that the second photoresist includes a photoresist-totally-removed region corresponding to a region of the semiconductor layer of the array substrate and a photoresist-totally-remaining region corresponding to the other regions;
   step 23: performing an etching process to remove the semiconductor film in the photoresist-totally-removed region; and
   step 24: removing the residual second photoresist.

4. The method for manufacturing an array substrate of an FFS type TFT-LCD according to claim 1, wherein the step 3 comprises:
   step 31: depositing the insulating film and the second metal film on the structure obtained in the step 2;
   step 32: applying third photoresist on the second metal film, and performing an exposing and developing process with respect to the third photoresist by using a prepared mask so that the third photoresist includes a photoresist-totally-remaining region corresponding to regions of the gate electrodes, the gate lines and the common electrode lines of the array substrate, a photoresist-totally-removed region corresponding to regions of the data lines in the PAD region of the array substrate, and a photoresist-partially-remaining region corresponding to the other regions of the array substrate;
   step 33: performing an etching process to remove the second metal film and the insulating film in the photoresist-totally-removed region and form patterns including connection holes of the data lines in the PAD region and the gate insulating layer;
   step 34: performing an ashing process with respect to the third photoresist to expose the second metal film in the photoresist-partially-remaining region and leave the third photoresist having a certain thickness in the photoresist-partially-remaining region;
   step 35: performing an etching process to remove the second metal film in the photoresist-partially-remaining region and form patterns including the common electrode lines, the gate electrodes and the gate lines; and
   step 36: removing the residual third photoresist.

5. The method for manufacturing an array substrate of an FFS type TFT-LCD according to claim 1, wherein the step 4 comprises:
   step 41: depositing the second transparent conductive film on the structure obtain in the step 3;
   step 42: applying fourth photoresist on the second transparent conductive film and performing an exposing and developing process with respect to the fourth photoresist by using a prepared mask so that the fourth photoresist comprises a photoresist-totally-removed region corresponding to regions of the common electrodes, the data lines in the PAD region and the gate lines in the PAD region of the array substrate, and a photoresist-totally-remaining region corresponding to the other regions;

step 43: performing an etching process to remove the second transparent conductive film in the photoresist-totally-removed region and form patterns including the common electrodes; and step 44: removing the residual fourth photoresist.

6. A method for manufacturing an array substrate of a fringe-field switch (FFS) type thin film transistor liquid crystal display (TFT-LCD) comprising the steps of:

step 1: forming a first transparent conductive film, a first metal film and an impurity-doped semiconductor film on a transparent substrate sequentially, and then patterning the stack of the first transparent conductive film, the first metal film and the impurity-doped semiconductor film so as to form patterns including source electrodes, drain electrodes, data lines and pixel electrodes;

step 2: forming a semiconductor film, and patterning the semiconductor film so as to form a pattern of the impurity-doped semiconductor layer and a pattern of the semiconductor layer including TFT channels; and step 3': forming an insulating film and a second metal film, and patterning the insulating film and the second metal film, then forming a second transparent conductive film and performing a lifting-off process and an etching process, so as to form patterns including connection holes for the data lines in the PAD region, gate lines, gate electrodes and common electrode lines.

7. The method for manufacturing an array substrate of an FFS type TFT-LCD according to claim 6, wherein the step 1 comprises:

step 11: depositing the first transparent conductive film, the first metal film and the impurity-doped semiconductor film on the transparent substrate sequentially;

step 12: applying first photoresist on the impurity-doped semiconductor film, and performing an exposing and developing process with respect to the photoresist by using a prepared mask so that the photoresist comprises: a photoresist-totally-remaining region corresponding to regions of the data lines, the source electrodes and the drain electrodes of the array substrate, a photoresist-partially-remaining region corresponding to regions of the pixel electrodes of the array substrate and a photoresist-totally-removed region corresponding to the other regions of the array substrate;

step 13: performing an etching process to remove the impurity-doped semiconductor film, the first metal film and the first transparent conductive film in the photoresist-totally-removed region and form patterns including the data lines and the pixel electrodes;

step 14: performing an ashing process with respect to the first photoresist to expose the impurity-doped semiconductor film in the photoresist-partially-remaining region and leave the first photoresist having a certain thickness in the photoresist-totally-remaining region;

step 15: performing an etching process to remove the impurity-doped semiconductor 400 and the first metal film in the photoresist-partially-remaining region and form patterns including the source electrodes and the drain electrodes; and step 16: removing the residual first photoresist.

8. The method for manufacturing an array substrate of an FFS type TFT-LCD according to claim 6, wherein the step 2 comprises:

step 21: depositing the semiconductor film on the structure obtained in the step 1;

step 22: applying second photoresist on the semiconductor film and performing an exposing and developing process with respect to the second photoresist by using a prepared mask so that the second photoresist includes a photoresist-totally-removed region corresponding to a region of the semiconductor layer of the array substrate and a photoresist-totally-remaining region corresponding to the other regions;

step 23: performing an etching process to remove the semiconductor film in the photoresist-totally-removed region and form a pattern of the impurity-doped semiconductor layer and a pattern of the semiconductor layer having TFT channels; and step 24: removing the residual second photoresist.

9. The method for manufacturing an array substrate of an FFS type TFT-LCD according to claim 6, wherein the step 3' comprises:

step 31': depositing the insulating film and the second metal film on the structure obtained in the step 2;

step 32': applying third photoresist on the second metal film, and performing an exposing and developing process with respect to the third photoresist by using a prepared mask so that the third photoresist includes a photoresist-totally-remaining region, a first photoresist-partially-remaining region, a second photoresist-partially-remaining region and a photoresist-totally-removed region, wherein after the development is performed, the photoresist in the second photoresist-partially-remaining region is thicker than photoresist in the first photoresist-partially-remaining region, and wherein the photoresist-totally-removed region corresponds to regions of the data lines in the PAD region of the array substrate, the first photoresist-partially-remaining region corresponds to regions of the common electrodes of the array substrate, the second photoresist-partially-remaining region corresponds to regions of the gate lines and the gate electrodes of the array substrate, and the photoresist-totally-remaining region corresponds to the other regions of the array substrate;

step 33': performing an etching process to remove the insulating film and the second metal film in the photoresist-totally-removed region and form patterns including connection holes for the data lines in the PAD region and the gate insulating layer;

step 34': performing an ashing process with respect to the third photoresist to expose the second metal film in the first photoresist-partially-remaining region and leave the third photoresist having a certain thickness in the second photoresist-partially-remaining region and the photoresist-totally-remaining region;

step 35': performing an etching process to remove the second metal film in the first photoresist-partially-remaining region;

step 36': performing an ashing process with respect to the photoresist in the step 35' to expose the second metal film in the second photoresist-partially-remaining region and leave the third photoresist having a certain thickness in the photoresist-totally-remaining region;

step 37': depositing the second transparent conductive film;

step 38': performing a lifting-off process to remove the third photoresist and the second transparent conductive film deposited on the third photoresist and form patterns including the common electrode; and step 39': performing an etching process to remove the second metal film in the photoresist-totally-remaining region and form patterns including the gate lines and the gate electrodes.

10. A method for manufacturing an array substrate of a fringe-field switch (FFS) type thin film transistor liquid crystal display (TFT-LCD) comprising the steps of:

step 100: forming a semiconductor film and an impurity-doped semiconductor film on a transparent substrate sequentially, then patterning the stack of the semiconductor film and the impurity-doped semiconductor film so as to form patterns including a semiconductor layer and an impurity-doped semiconductor layer;

step 200: forming a first transparent conductive film and a first metal film, and patterning the stack of the first transparent conductive film and the first metal film to form patterns including source electrodes, drain electrodes, the impurity-doped semiconductor layer, TFT channels, data lines and pixel electrodes;

step 300: depositing an insulating film, and patterning the insulating film so as to form patterns including connection holes for the data lines in the PAD region; and step 400: forming a second transparent conductive film and a second metal film, and patterning the stack of the second transparent conductive film and the second metal film so as to form patterns including gate lines, gate electrodes and common electrodes.

11. The method for manufacturing an array substrate of an FFS type TFT-LCD according to claim 10, wherein the step 100 comprises:

step 1100: depositing the semiconductor film and the impurity-doped semiconductor film on the transparent substrate sequentially;

step 1200: applying first photoresist on the impurity-doped semiconductor film, and performing an exposing and developing process with respect to the first photoresist by using a prepared mask so that the photoresist comprises a photoresist-totally-remaining region corresponding to a region of the semiconductor layer of the array substrate, and a photoresist-totally-removed region corresponding to the other regions of the array substrate;

step 1300: performing an etching process to remove the impurity-doped semiconductor film and the semiconductor film in the photoresist-totally-removed region and form patterns including the semiconductor layer; and step 1400: removing the residual first photoresist.

12. The method for manufacturing an array substrate of an FFS type TFT-LCD according to claim 10, wherein the step 200 comprises:

step 2100: depositing the first transparent conductive film and the first metal film on the structure obtained in the step 100;

step 2200: applying second photoresist on the first metal film, and performing an exposing and developing process with respect to the second photoresist by using a prepared mask so that the second photoresist can include a photoresist-totally-remaining region, a photoresist-partially-remaining region and a photoresist-totally-removed region, wherein photoresist-totally-remaining region corresponds to regions of the data lines, the source electrodes and the drain electrodes of the array substrate, the photoresist-partially-remaining region corresponds to regions of the pixel electrodes of the array substrate, and the photoresist-totally-removed region corresponds to the other regions of the array substrate;

step 2300: performing an etching process to remove the first metal film and the first transparent conductive film in the photoresist-totally-removed region and form patterns including the data lines and the pixel electrodes;

step 2400: performing an ashing process with respect to the second photoresist to expose the first metal film in the photoresist-partially-remaining region and leave the photoresist having a certain thickness in the photoresist-totally-remaining region.

step 2500: performing an etching process to remove the first metal film and the impurity-doped semiconductor film in the photoresist-partially-remaining region and form patterns including the TFT channels, the source electrodes and the drain electrodes; and step 2600: removing the residual second photoresist.

13. The method for manufacturing an array substrate of an FFS type TFT-LCD according to claim 10, wherein the step 300 comprises:

step 3100: depositing the insulating film on the structure obtained in the step 200;

step 3200: applying third photoresist on the insulating film, and performing an exposing and developing process with respect to the third photoresist by using a prepared mask so that the third photoresist can include a photoresist-totally-removed region corresponding to regions of the data lines in the PAD region of the array substrate, and a photoresist-totally-remaining region corresponding to the other regions of the array substrate;

step 3300: performing an etching process to remove the insulating film in the photoresist-totally-removed region and form a pattern including the gate insulating layer; and step 3400: removing the residual third photoresist.

14. The method for manufacturing an array substrate of an FFS type TFT-LCD according to claim 10, wherein the step 400 comprises:

step 4100: depositing the second transparent conductive film and the second metal film 600 on the structure obtained in the step 300;

step 4200: applying fourth photoresist on the second metal film, performing an exposing and developing process to the fourth photoresist by using a prepared mask so that the fourth photoresist can include a photoresist-totally-remaining region, a photoresist-partially-remaining region and a photoresist-totally-removed region, wherein photoresist-totally-remaining region corresponds to regions of the gate electrodes, the gate lines, the common electrode lines, and the data lines in the PAD region of the array substrate, the photoresist-partially-remaining region corresponds to regions of the common electrodes of the array substrate, and the photoresist-totally-removed region corresponds to the other regions of the array substrate;

step 4300: performing an etching process to remove the second metal film and the second transparent conductive film in the photoresist-totally-removed region and form patterns including the gate lines, the gate electrodes, the common electrode lines, and the common electrodes;

step 4400: performing an ashing process with respect to the fourth photoresist to expose the second metal film in the photoresist-partially-remaining region, and leave the fourth photoresist having a certain thickness in the photoresist-totally-remaining region;

step 4500: performing an etching process to remove the second metal film in the partially exposed region and expose the common electrode; and step 4600: removing the residual fourth photoresist.

15. The method for manufacturing an array substrate of an FFS type TFT-LCD according to claim 10, wherein in the step 100, an insulating film is formed before the semiconductor film is deposited, and the insulating film and the semiconductor film are patterned together.

* * * * *